United States Patent
Capasso et al.

[11] Patent Number: 6,148,012
[45] Date of Patent: Nov. 14, 2000

[54] MULTIPLE WAVELENGTH QUANTUM CASCADE LIGHT SOURCE

[75] Inventors: Federico Capasso, Westfield; Alfred Yi Cho, Summit; Claire F. Gmachl, Millburn; Albert Lee Hutchinson, Piscataway; Deborah Lee Sivco, Warren; Alessandro Tredicucci, Summit, all of N.J.

[73] Assignee: Lucent Technologies Inc., Murray Hill, N.J.

[21] Appl. No.: 09/176,527

[22] Filed: Oct. 21, 1998

[51] Int. Cl.[7] ................................. H01S 5/00; H01S 3/10
[52] U.S. Cl. ................................. 372/45; 372/46; 372/23
[58] Field of Search ................................. 372/45, 46, 23; 257/15, 17

[56] References Cited

U.S. PATENT DOCUMENTS 5,978,397  11/1999  Capasso et al. ..................... 372/45

OTHER PUBLICATIONS

R. Dingle et al., Direct Observation of Superlattice Formation in a Semiconductor Heterostructure . . . , Phys. Rev. Lett., vol. 34, No. 21, pp 1327–1330 (1975) May, 1975.

J. Faist et al., Science, Quantum Cascade Laser, vol. 264, pp. 553–556 (1994) Apr., 1994.

F. Capasso et al., Infrared ( 4–11$\mu$m) Quantum Cascade Lasers . . . , Solid State Comm., vol. 102, No. 2–3, pp. 231–236 (1997) (no month available).

N.S. Wingreen et al., Quantum–Dot Cascade Laser: Proposal for an Ultra low–Threshold Semiconductor Laser . . . , IEEE J. Quantum Electr., vol. 33, No. 7, pp. 1170–1173 (1997) Jul. 1997.

G. Scamarcio et al., High–Power Infrared (8–Micrometer Wavelength) Superlattice Lasers . . . , Science, vol. 276, pp 773–776 (1997) May 1997.

C. Sirtori, Dual–Wavelength Emisson From Optically Cascaded Intersubband Transitions . . . , Opt. Lett., vol. 23, No. 6, pp. 463–465 (1998) Mar. 1998.

A. Tredicucci et al., High–power inter–miniband Lasing in Intrinsci Superlattices . . . , Appl. Phys. Lett., vol. 72, No. 19, pp. 2388–2390 (1998) May 1998.

*Primary Examiner*—Teresa M. Arroyo
*Assistant Examiner*—Q. P. Leung
*Attorney, Agent, or Firm*—Michael J. Urbano

[57] ABSTRACT

A multiple wavelength quantum cascade (QC) superlattice (SL) light source has at least three energy levels in each radiative transition (RT) region, and electron transitions between the levels give rise to emission lines at different wavelengths. In one embodiment, a lower miniband has at least a first energy level and an upper miniband has at least third and fourth energy levels. In another embodiment, the lower miniband has first and second energy levels. In both cases, electron transitions between a first pair of the upper and lower levels generates light at a first spontaneous emission line having a center wavelength $\lambda_1$ and a line broadening first energy, and electron transitions between a second pair of the upper and lower levels generates light at a second spontaneous emission line having a center wavelength $\lambda_2$ and a line broadening second energy. The energy separation of the center wavelengths is greater than the larger of the first and second line broadening energies, and means are provided for inhibiting the relaxation of electrons from the fourth level to said third level. In a preferred embodiment, which is particularly suited to lasers made from Group III-V compound semiconductors, the inhibiting means hinders the emission of optical phonons. One way to inhibit these phonons is to make the energy separation of the upper levels less than the energy of an optical phonon in the active region.

16 Claims, 4 Drawing Sheets

FIG. 7     FIG. 8     FIG. 9
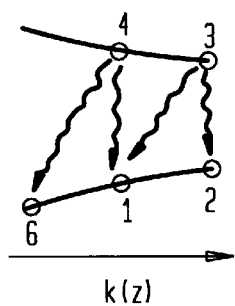
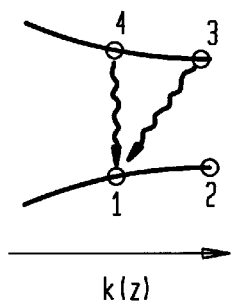
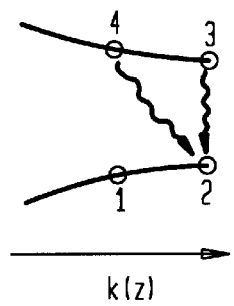
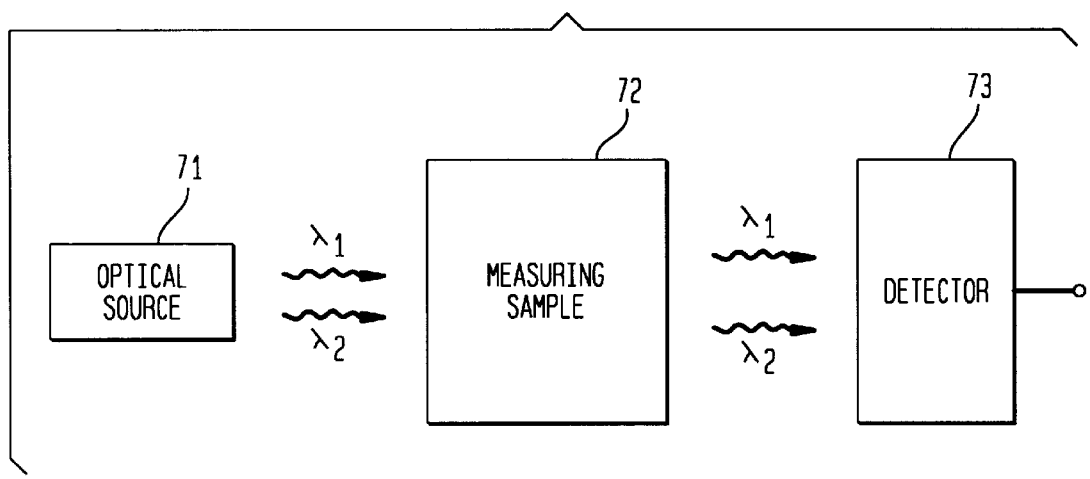
FIG. 10

MULTIPLE WAVELENGTH QUANTUM CASCADE LIGHT SOURCE

GOVERNMENT CONTRACTS

This invention was made with Government support under contract No. DAAH04-96-C-0026 awarded by the DARPA/US Army Research Office and under grant No. N00014-96-C-0288 awarded by the Office of Naval Research. The Government has certain rights in this invention.

FIELD OF THE INVENTION

This invention relates generally to semiconductor light sources, and, more particularly, to quantum cascade (QC) light sources, both incoherent, spontaneous emission sources (akin to LEDs) and coherent, stimulated emission sources (e.g., lasers).

BACKGROUND OF THE INVENTION

As described by F. Capasso et al. in *Solid State Communications*, Vol. 102, No. 2–3, pp. 231–236 (1997) and by J. Faist et al. in *Science*, Vol. 264, pp. 553–556 (1994), which are incorporated herein by reference, a QC laser is based on intersubband transitions between excited states of coupled quantum wells and on resonant tunneling as the pumping mechanism. Unlike all other semiconductor lasers (e.g., diode lasers), the wavelength of the lasing emission of a QC laser is essentially determined by quantum confinement; i.e., by the thickness of the layers of the active region rather than by the bandgap of the active region material. As such it can be tailored over a very wide range using the same semiconductor material. For example, QC lasers with AlInAs/GaInAs active regions have operated at mid-infrared wavelengths in the 3 to 13 $\mu$m range. In diode lasers, in contrast, the bandgap of the active region is the main factor in determining the lasing wavelength. Thus, to obtain lasing operation at comparable infrared wavelengths the prior art has largely resorted to the more temperature sensitive and more difficult-to-process lead salt materials system.

More specifically, diode lasers, including quantum well lasers, rely on transitions between energy bands in which conduction band electrons and valence band holes, injected into the active region through a forward-biased p-n junction, radiatively recombine across the bandgap. Thus, as noted above, the bandgap essentially determines the lasing wavelength. In contrast, the QC laser relies on only one type of carrier; i.e., it is a unipolar semiconductor laser in which electronic transitions between conduction band states arise from size quantization in the active region heterostructure.

Although most of the literature has focused on QC optical (i.e., photon) sources for operation as coherent, stimulated emission sources (e.g., lasers), these sources also find application as incoherent, spontaneous emission devices (akin to LEDs although carrier injection across a p-n junction is not involved). Such QC sources, especially lasers, have a variety of potential uses; for example, in trace gas analysis, environmental monitoring, industrial process control, combustion diagnostics, and medical diagnostics.

In at least some of the potential uses (as well as in quantum optics studies) it would be desirable to have available a semiconductor optical source that emits light at more than one wavelength. For example, such a source would be extremely useful for those techniques, like differential absorption lidar (DIAL), where scattering has to be evaluated and compared at two different wavelengths. In addition, if the photons that are emitted at the two wavelengths are correlated, then such a source would make it possible to eliminate spontaneous emission noise in measurements that require beating or heterodyning of two laser emissions. This application discloses such an optical (photon) source.

Dual wavelength QC lasers have been described in the prior art. For example, copending patent Ser. No. 5,978,397 filed on Mar. 27, 1997 (Capasso et al. 43-74-7-11-8-12 entitled *Article Comprising an Electric Field-Tunable Semiconductor Laser*) and assigned to the assignee hereof, discloses, inter alia, a divided-electrode QC laser that can emit light at two wavelengths. Such a laser requires more complex circuitry, and the two wavelengths have relatively small separation. Another illustration, copending patent application Ser. No. 09/033,250 filed on Mar. 2, 1998 (Capasso et al. 48-80-12-15-12-17-1 entitled *Article Comprising a Dual-Wavelength Quantum Cascade Photon Source*) and also assigned to the assignee hereof, describes a 3-level QC light source that emits light at two wavelengths by either of two mechanisms: (1) by a pair of vertical electron transitions at different wavelengths in a single quantum well, or (2) by a diagonal electron transition at one wavelength from one well into an adjacent well followed by a vertical electron transition at a different wavelength from the latter well. This source, also described by C. Sirtori et al. in *Optics Lett.*, Vol. 23, pp. 463 (1998), exhibited well-resolved luminescence peaks at wavelengths of 8 $\mu$m and 10 $\mu$m. However, the transitions were inefficient, and it was difficult to optimize both at the same time. Consequently, laser action was achieved on only one transition from the upper level to the middle level. This publication, as well as both of the aforementioned patent applications, are incorporated herein by reference.

Thus, a need remains for a QC light source which is capable of efficient, simultaneous emission at multiple wavelengths, and especially for a QC laser capable of such emission at two or more wavelengths.

SUMMARY OF THE INVENTION

In accordance with one aspect of our invention, a multiple wavelength QC superlattice (SL) light source has at least three energy levels in each radiative transition (RT) region, and electron transitions between the levels give rise to emission lines at different wavelengths. In one embodiment, a lower miniband has at least a first energy level and an upper miniband has third and fourth energy levels. In another embodiment, the lower miniband has first and second energy levels. In both cases, electron transitions between a first pair of the upper and lower levels generates light at a first spontaneous emission line having a center wavelength $\lambda_1$ and a line broadening first energy, and electron transitions between a second pair of the upper and lower levels generates light at a second spontaneous emission line having a center wavelength $\lambda_2$ and a line broadening second energy. The energy separation of the center wavelengths is greater than the larger of the first and second line broadening energies, and means are provided for inhibiting the relaxation of electrons from the fourth level to said third level.

In a preferred embodiment, which is particularly suited to lasers made from Group III-V compound semiconductors, the inhibiting means hinders the emission of optical phonons. One way to inhibit these phonons is to make the energy separation of the upper levels less than the energy of an optical phonon in the active region.

BRIEF DESCRIPTION OF THE DRAWING

Our invention, together with its various features and advantages, can be readily understood from the following more detailed description taken in conjunction with the accompanying drawing, in which.

Figure 2:
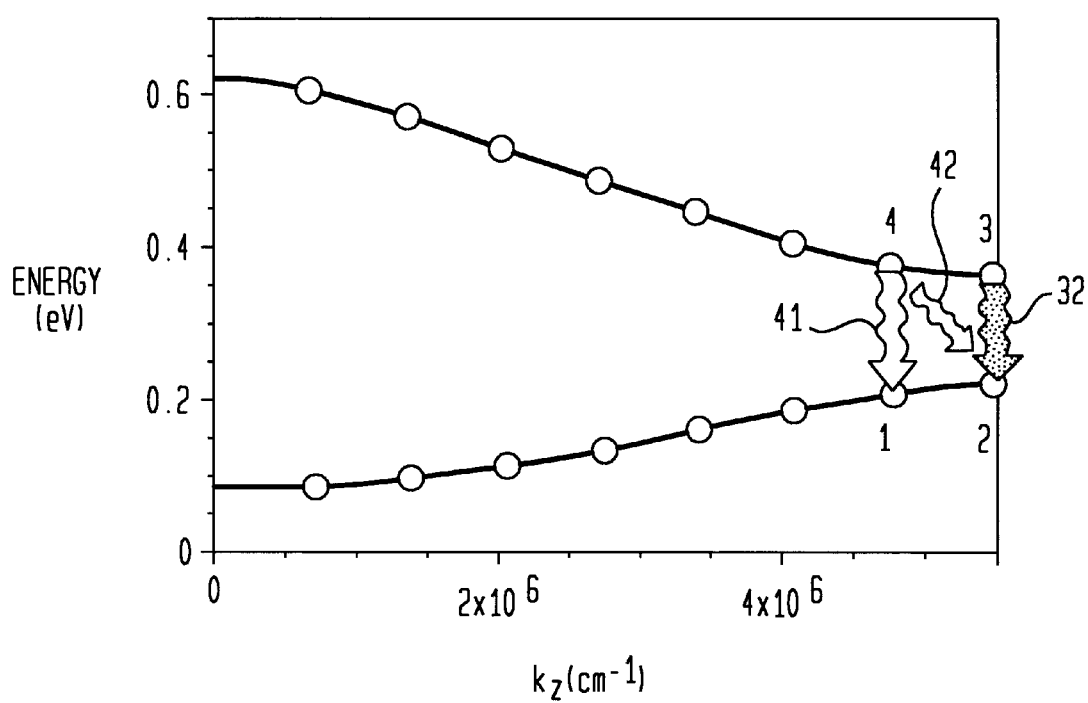
FIG. 2 is a graph of energy vs. momentum $k_z$ showing the dispersion of the first two minibands of a SL with InGaAs wells 4.6 nm thick and AlInAs barriers 1.1 nm thick, as calculated with a well-known Kronig-Penney model in the reduced Brillouin zone. The arrows (41, 42 and 32) indicate the three transitions (4→1, 4→2 and 3→2, respectively) where laser action takes place in various embodiments of our invention. The hollow circles indicate the eight individual states resulting from a finite number of SL periods.
Figure 4:
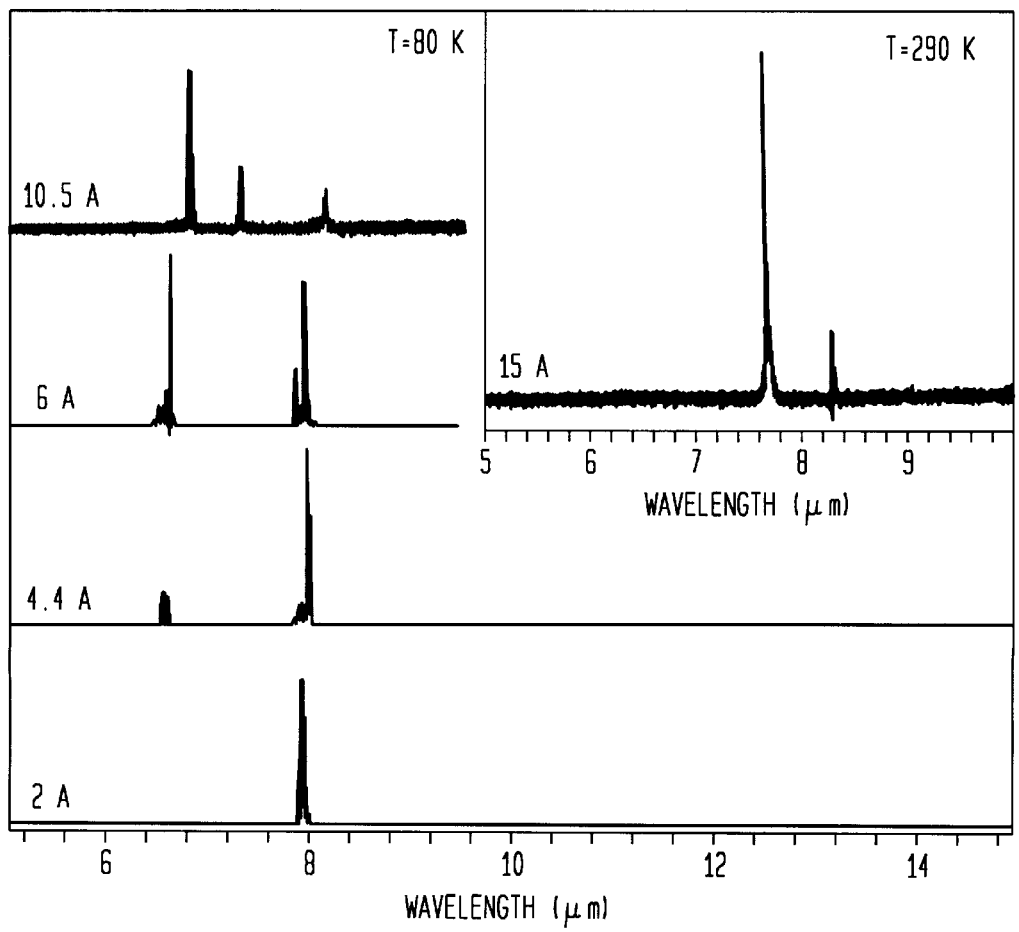
Figure 5:
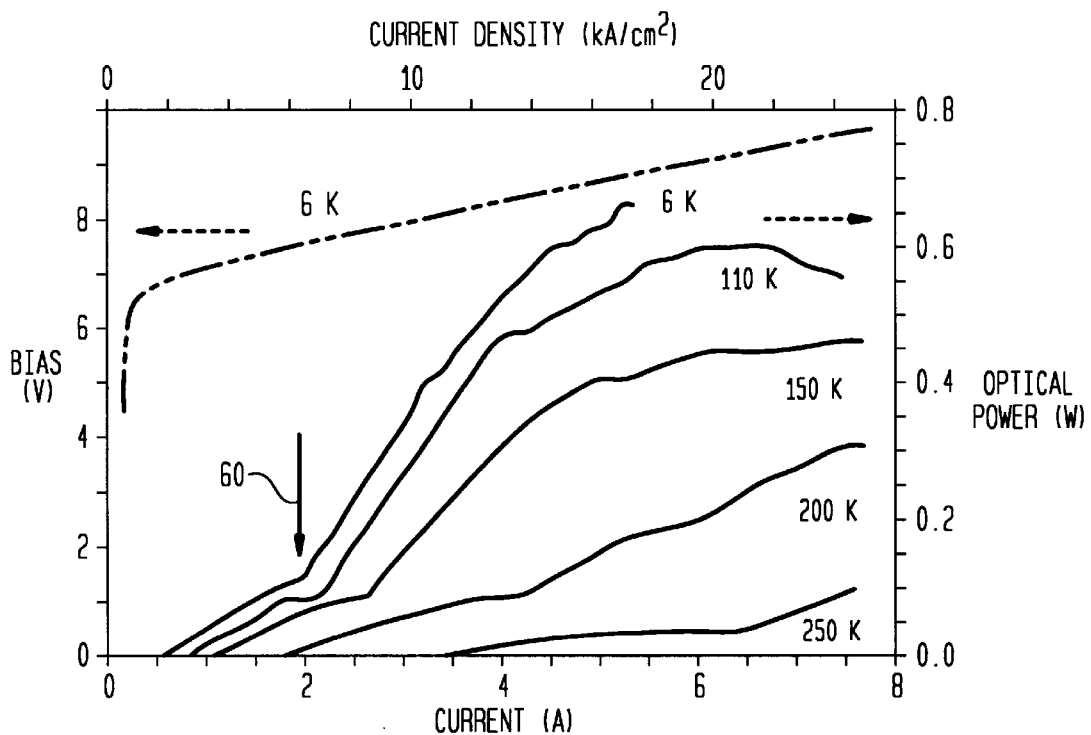
Figure 6:
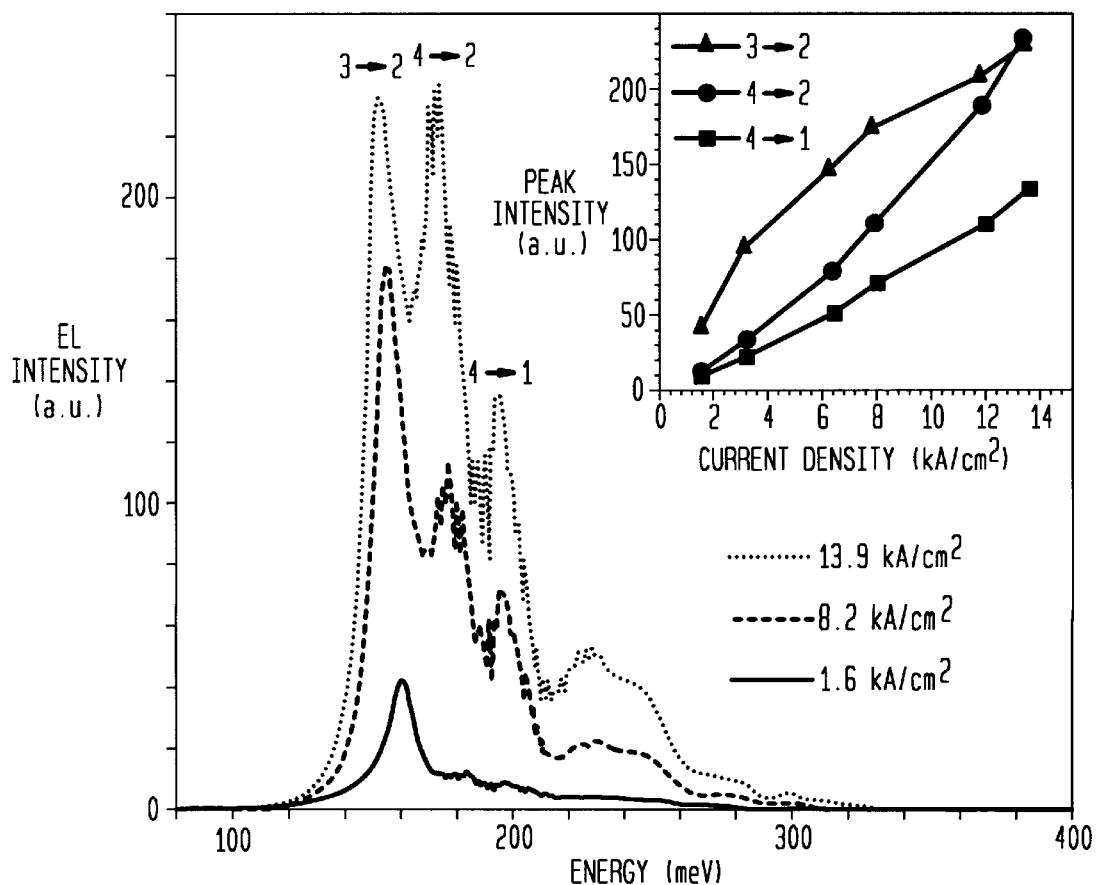

2.2/4.3/1.1/4.5/1.1/4.6/1.1/4.6/1.1/4.6/1.1/4.6/1.1/4.61.1/
4.6/4.0/1.1/3.7/1.2/3.4/1.4/3.1/1.6/2.7/1.9/2.3/2.3/2.0/
2.7/1.7/3.3, where the thicknesses of the AlInAs barrier layers are in bold face type, and the underlined thicknesses represent the Si doped layers (n=5×10$^{17}$ cm$^3$). The thicknesses listed above are broken into two lines for convenience only, it being understood that the list is intended to be continuous (i.e., the layer at the end of the first line is physically adjacent the layer at the beginning of the second line;

FIG. 4 shows the emission spectra of a QC laser from sample D2395 in accordance with one embodiment of our invention. The laser had an elongated mesa geometry and cleaved facets, with the mesa stripe being 3 mm long and 17 μm wide. It was driven with current pulses (50 ns pulse width, 84.2 kHz repetition rate) of various amplitudes at a temperature of 80 K. A room-temperature spectrum is plotted in the inset. For the 10.5 A and 15 A spectra a repetition rate of 5 kHz was used;

FIG. 5 shows the light-current (L-I) characteristics as measured from a single facet of a QC laser from sample D2395 with 50% collection efficiency at various heat-sink temperatures. The laser was driven with current pulses (50 ns pulse width, 5 kHz repetition rate). The laser output was detected using a room-temperature, fast HgCdTe detector and an adjustable gate. The current-voltage (I-V) characteristic at 6 K is also shown;

FIG. 6 shows the electroluminescence (EL) spectra as measured from a QC laser having a round mesa (125 μm diameter); i.e., a spontaneous emission QC device in accordance with another embodiment of our invention. Measurements were made with a step-scan lock-in technique at a temperature of 5 K for various drive currents. The fine structure superimposed on the main peaks above 170 meV is due to the absorption of water in the optical path. In the inset the intensity of each peak is plotted as a function of current density;

FIGS. 7–9 are graphs of energy vs. momentum similar to FIG. 2 but depicting other illustrative multiple wavelength transitions; e.g., a 5M configuration (FIG. 7) and two 3V configurations (FIGS. 8–9); and FIG. 10 schematically shows an exemplary measuring apparatus according to another aspect of our invention.

In the interest of clarity and simplicity, the FIGS. 1, 3 and 7–10 have not been drawn to scale. In addition, when describing physical or optical dimensions, the symbol A stands for Angstroms, whereas when describing electric current, it stands for Amperes.

DETAILED DESCRIPTION OF THE INVENTION

General Structure

Figure 1:
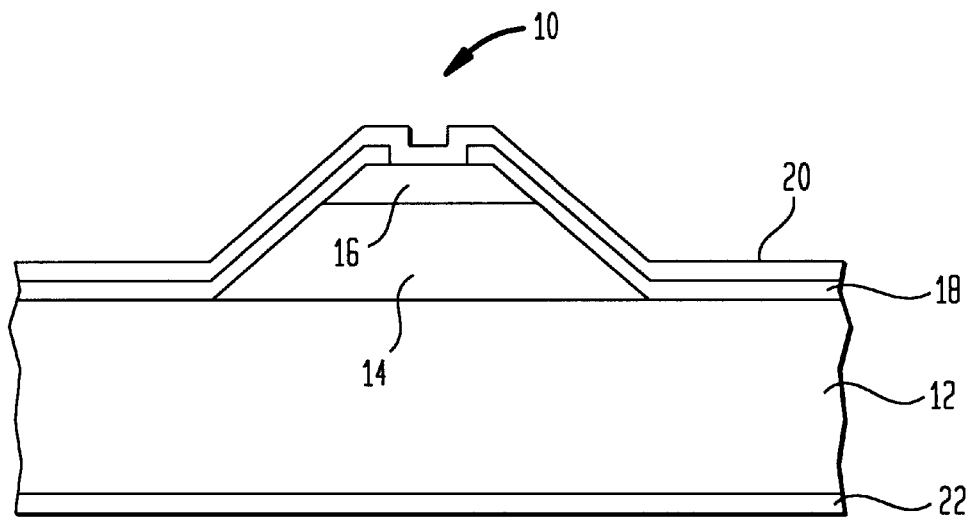
FIG. 1 is a schematic, cross-sectional view of a QC laser in accordance with one embodiment of our invention.

With reference now to FIG. 1, a QC SL semiconductor light emitter 10 comprises a QC SL active region 14 sandwiched between an upper cladding region 16 and a substrate 12 which serves as a lower cladding region. Alternatively, a lower cladding region, separate from the substrate, may be formed between the substrate and the active region. The upper cladding region 16 is illustratively formed in the shape of a mesa or trapezoid typical of ridge waveguide laser structures. The mesa may be shallow-etched so as to stop at the top of the active region 14, or, as shown, it may be deep-etched so that the mesa extends through the active region. In either case, an electrically insulating layer 18 (e.g., Si$_3$N$_4$ or SiO$_2$) is formed over the top of the device and is patterned to form an opening which exposes a portion of the top of the mesa. A first electrode 20 is formed over the insulating layer 18 and in the opening so as to contact the upper cladding region (usually by means of a highly doped contact-facilitating layer, not shown), and a second electrode 22 is formed on the substrate 12.

The substrate itself may be a single crystal semiconductor body or a combination of such a body with another layer (e.g., an epitaxial layer grown on the top surface of the body). Illustratively, lasers of this type are fabricated from Group III-V compound semiconductors; e.g., In-based Group III-V compounds such as GaInAs and AlInAs.

Drive circuitry, not shown, is coupled across the electrodes in order to provide an external voltage bias and to supply pumping energy (e.g., electric current) to the laser of sufficient magnitude to generate light. Below threshold the emitter operates as an incoherent, spontaneous emission source, whereas above threshold it operates as a coherent, stimulated emission source. In the latter case, when provided with optical feedback, the source functions as laser. Suitable optical feedback is typically provided by an optical cavity resonator formed, for example, by cleaved crystal facets, distributed feedback (DFB)gratings, distributed Bragg reflectors (DBRs), or a combination of them.

Superlattice QC Active Region

The term QC active region includes a multiplicity of essentially identical radiative transition (RT) regions and a multiplicity of injection/relaxation (I/R) regions interleaved with the RT regions. The RT regions, which include quantum well regions interleaved with barrier regions, as well as the I/R regions each comprise a multiplicity of semiconductor layers. At least some of the layers of each I/R region are doped, but in any case the I/R regions as well as the RT regions are unipolar. In accordance with one aspect of our invention the active region is also a superlattice (SL).

SLs are multi-layered semiconductor structures with unique electronic properties. These structures comprise a periodic stack of alternating thin (e.g., nanometer thick) layers of two different semiconductor materials having different bandgaps (i.e., lower bandgap quantum well (QW)

layers interleaved with wider bandgap barrier layers). As described by G. Scamarcio et al., *Science*, Vol. 276, pp. 773–776 (May 1997), and incorporated herein by reference, the period of this structure (~5 nm) is typically much larger than the lattice constant of the bulk crystalline constituents (~0.5 nm). This superimposed potential splits the conduction and valence bands into a series of much narrower bands (typically tens to a few hundred millielectron volts wide in the strong tunnel-coupling regime) called minibands, which are separated by energy gaps (minigaps) along the direction perpendicular to the layers. To form a miniband requires that the wavefunctions of the states in each of the QWs are delocalized; i.e., the wavefunctions extend over many QWs, thus indicating that the QWs are strongly coupled to one another; they are not localized in which case the QWs would be effectively decoupled from one another.

In a QC SL source emission in each RT region is achieved between minibands through unipolar (electron) injection by miniband transport through each I/R region. Generation of light on a single emission line involves a vertical transition between energy states at the bottom of an upper conduction miniband and empty states near the top of a lower conduction miniband. This emission takes place at a photon energy well below the energy band gap of the barrier and QW materials. The center wavelength of these QC SL sources is determined by the minigap and can be selected over a large region of the IR spectrum by changing the barrier and QW thicknesses.

In order for QC SL lasers to properly function aflatband condition of the minibands should exist; i.e., two conditions should be met: (1) macroscopic alignment of the RT and I/R regions with one another, and (2) microscopic alignment of the upper and lower laser energy levels across the RTs. However, in the presence of the an applied field (e.g., the external bias applied transverse to the layers to induce lasing) the quantum states, from QW layer to QW layer, shift to higher and higher energies in the direction of the field. In Scamarcio et al., supra, this problem was addressed by heavily doping the entirety of all of the RT regions so that the dopant ions and corresponding extrinsic electrons produced a screening field which compensated the applied field (i.e., prevented significant field penetration into the active region). On the other hand, in Tredicucci et al., *Appl. Phys. Lett.*, Vol. 72, No. 19, pp. 2388–2390 (1998), which is also incorporated herein by reference, only the ends of the I/R regions close to the RT regions were doped. Here, the dopant ions and their extrinsic electrons acted like opposing plates of a capacitor to screen the applied field. In this fashion, the SL regions were almost field free, with the upper miniband of each repeat unit aligned with the lower miniband of the previous, adjacent unit (in the direction of electron flow). A third option for achieving the desired flatband condition is to pre-bias the internal electronic potential of the RT SLs (e.g., by grading the thicknesses of the QW layers), as described by F. Capasso et al. in copending patent Ser. No. 6,055,254 filed on Sep. 23, 1998 (Capasso et al. 55-89-8-24-20-5 entitled *Quantum Cascade Light Emitter with Pre-biased Internal Electronic Potential*), assigned to the assignee hereof, and also incorporated herein by reference.

Multiple Wavelength QC SL Optical Source

In accordance with one aspect of our invention, a multiple wavelength QC SL optical source is based on distinct electronic transitions of the same active region material. These transitions between quantum states extending over the same region connect conduction energy minibands of finite superlattices. Our invention exploits a regime between "infinite" SLs which have continuous minibands and quantum well structures which have individual confined subbands. The wavefunctions of electronic states of our QC sources extend over many QWs and are grouped together in miniband-like manifolds, their energy separation being sufficiently large when compared to the line broadening that they still appear as distinct entities in the optical response (e.g., optical output spectrum). In other words, we can speak of minibands with a $E(k_z)$ dispersion, but the values of $k_z$ are quantized according to the number of periods in the SL. For example, SLs having eight-periods result in discrete minibands having eight states. Eight well-defined optically-allowed transitions vertical in k-space with large oscillator strengths can be obtained between the two minibands, each with a distinct frequency, and each corresponding to a different point of the Brillouin minizone, as shown in FIG. 2.

Figure 3:
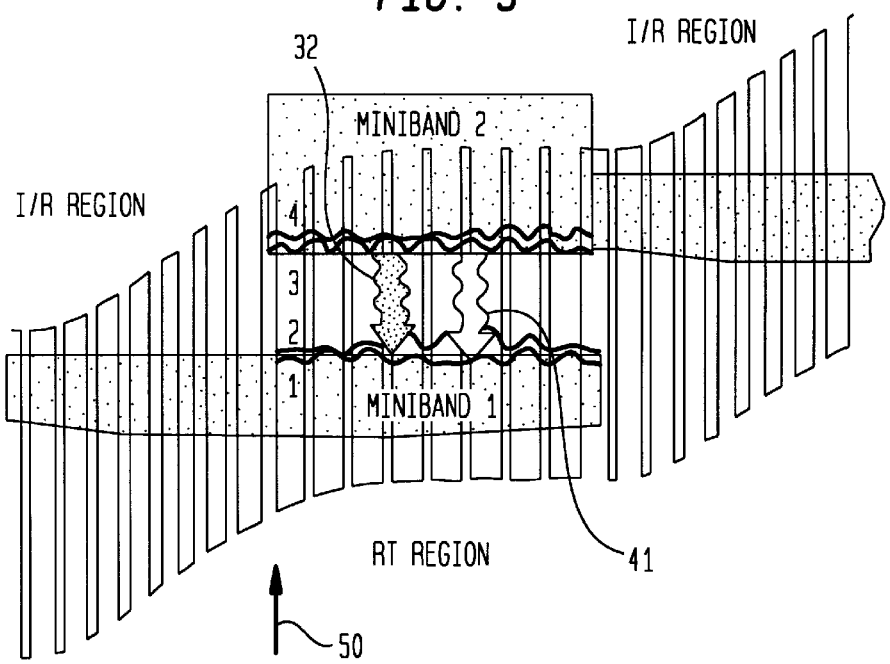
FIG. 3 shows a conduction band profile of one RT SL region with the adjacent injection/relaxation (I/R) regions at a design electric field of 29 kV/cm. The shaded regions indicate the energy and spatial extension of the manifold of miniband-like states. The moduli squared of the wavefunctions of the four relevant energy levels (4, 3, 2, and 1) and the corresponding laser transitions (wavy arrows 41, 42 and 32) are also shown. Starting from the barrier indicated by a vertical arrow 50, the thicknesses in nanometers are (left to right)

One embodiment of our invention for operation as a QC laser is designed so that laser action takes place, as shown in FIG. 3, simultaneously on at least two pairs of transitions between two upper states 4 and 3 located in the bottom of the upper miniband 2 and two lower states 2 and 1 located in the top of the lower miniband 1. For example, one pair of transitions indicated as 4→1 and 3→2 are depicted as wavy arrows 41 and 32, respectively, in FIGS. 2 & 3. These transitions are known as vertical transitions in k-space. The energy separation between the upper states 4 and 3 is important for two reasons: one related to broadening of the emission lines and the other related to electron relaxation between the upper levels.

First, the energy separation of the upper states 4 and 3 should be large enough that the energy difference $\Delta E$ between the emitted photon energies $E_{4-1}$ and $E_{3-2}$ is greater than the broadening of the inter-miniband transitions. This condition assumes that the line broadening energy is the same for both emission lines. If, however, the two lines have different line broadening energies, then $\Delta E$ should be greater than the larger of those two energies. The logical extension to a laser with more than two emission lines requires that the condition be satisfied between adjacent pairs of emission lines.

Second, since a sufficient population inversion has to be realized between states 4 and 1, the relaxation rate of electrons from state 4 to state 3 should be kept small. In QC optical sources made of Group III-V compound semiconductor materials a general approach to keeping this relaxation rate small is to inhibit the emission of optical phonons, the dominant scattering mechanism in such materials. In turn, inhibiting optical phonon emission can be achieved in several ways: (1) by confining the motion of electrons in the plane of the layers (e.g., by constructing a well known quantum box that confines the electrons; see, for example, N. Wingreen et al., *IEEE J Quantum Electr.*, Vol. 33, No. 7, pp. 1170–1173 (1997), which is incorporated herein by reference), or (2) by designing the energy separation between the upper levels (i.e., $E_{4-3}$) to be less than the optical phonon energy $E_{LO}$. The energy separation of the upper levels is controlled by the barrier layer thickness and the number of periods in the RT SLs; i.e., the energy separation is reduced by either increasing the barrier layer thickness or by increasing the number of periods in the RT SLs, where a period is the combination of a QW layer and a barrier layer.

In the material system described below (GaInAs/AlInAs grown lattice matched to InP) $E_{LO}$ equals about 34 meV, which not only impacts the energy separation of the upper levels, as discussed above, but also poses stringent requirements on the maximum acceptable broadening. To minimize the latter, we have used intrinsic RT SLs (e.g., undoped SLs with a background concentration n≈$10^{15}$ cm$^{-3}$). In addition, we prefer to keep the RT SLs essentially electric-field-free under the applied bias by the use of modulation-doped regions of the type described by Tredicucci et al., supra. In these structures electrons are spatially separated from their parent donors to generate an electric field that compensates the applied field across the SL RT regions, thereby providing for essentially flat upper and lower minibands. This structure leads to line broadening as small as ~15 meV. Perfect compensation of the applied field is not required. Some electric field penetration into the RT regions can be tolerated provided that the quantum states are still delocalized; i.e., the wavefunctions of the states extend over more than just a few QWs, and preferably extend over all of the QWs in each RT region.

A schematic conduction band diagram of one RT SL region with the two adjacent I/R regions, as computed self-consistently for a field of 29 kV/cm, is shown in FIG. 3. The miniband of each I/R region is designed to provide fast extraction of electrons from the miniband of the preceding RT SL region and is sufficiently broad to inject them efficiently into both state 4 and state 3 of the second miniband of the next RT SL (not shown). The terms preceding and next have the direction of electron flow as their frame of reference; i.e., preceding is upstream and next is downstream. Note that some of the QW wells of the RT SL may be narrowed to compensate for the conduction band profile that is not perfectly flat at the edges of the SL adjacent the I/Rs. In general, the RT SLs may be pre-biased in order to provide essentially flat minibands despite the presence of an applied field, following the teaching of the Capasso et al. patent Ser. No. 6,055,254, supra. Briefly, the latter application discloses the following: in at least a first subset of the QW layers, the thicknesses of the QW layers are varied from QW layer to QW layer so as to increase in the direction of the applied field. In addition, the thicknesses of a second subset of the barrier layers are also varied from barrier layer to barrier layer within the second subset so as to vary (either increase or decrease) in the direction of the applied field.

For the two transitions we have calculated the wavelengths $\lambda_{4-1}$=6.4 μm and $\lambda_{3-2}$=7.9 μm and the dipole elements $z_{4-1}$=1.9 nm and $z_{3-2}$=3.2 nm. The lifetimes of states 1 and 2 extremely short (~0.2–0.3 ps) due to fast intra-miniband relaxation, much shorter than the optical scattering times $\tau_{3-2}$~$\tau_{4-1}$=10.5 ps from state 3 to state 2 and from state 4 to state 1, respectively, which assures population inversion. Its value is, therefore, determined essentially by the total lifetimes of the states, which are computed to be $\tau_3$=0.9 ps and $\tau_4$=1.1 ps, neglecting the states 4→3 relaxation processes.

EXAMPLE

This example describes a Group III-V compound semiconductor, multiple-wavelength QC SL laser in accordance with one embodiment of our invention. Various materials, dimensions and operating conditions are provided by way of illustration only and, unless otherwise expressly stated, are not intended to limit the scope of the invention. As used herein, the term undoped means that a particular semiconductor layer or region is not intentionally doped; i.e., any doping of such a region or layer is relatively low and typically results from residual or background doping in the chamber used to grow the layers of the device.

Twenty five repeat units (RT SL regions plus I/R regions) were grown by molecular beam epitaxy (MBE) on an n-type InP substrate. They were embedded in a doped InGaAs/AlInAs multilayer structure identical to the one described in Tredicucci et al., supra, to provide optical confinement and ohmic contacts. Ridge waveguide devices of different mesa widths (12–18 μm) were fabricated by wet chemical etching and by subsequent deposition of both silicon nitride insulation and non-alloyed metallic contacts. Samples designated D2395 were then cleaved into laser bars (0.75–3 mm long) with the facets left uncoated. For the measurements described below the lasers were soldered to copper plates, wire-bonded, and mounted in a He-flow cryostat.

The composition of sample D2395 is shown in Table I.

TABLE I

| QC Laser Structure D2395 | Composition | Doping Concentration (cm$^{-3}$) | Thickness (A) |
|---|---|---|---|
| Contact-facilitating | GaInAs | n = 1 × $10^{20}$ | 100 |
| Cladding | GaInAs | n = 8 × $10^{18}$ | 5000 |
| Cladding | Digitally Graded IV | n = 5 × $10^{17}$ | 294 |
| Cladding | AlInAs | n = 5 × $10^{17}$ | 100 |
| Cladding | AlInAs | n = 2 × $10^{17}$ | 12000 |
| Cladding | AlInAs | n = 1 × $10^{17}$ | 12000 |
|  | Digitally Graded III | n = 1 × $10^{17}$ | 294 |
| Core | GaInAs | n = 5 × $10^{16}$ | 2000 |
| Core | AlInAs | undoped | 22 |
| Core | I/R region | n = 5 × $10^{17}$ | 384 |
| (Repeat Unit; N = 25) | RT region | undoped | 463 |
| Core | Digitally Graded II | n = 5 × $10^{17}$ | 384 |
| Core | GaInAs | n = 5 × $10^{16}$ | 4000 |
|  | Digitally Graded I | n = 1 × $10^{17}$ | 250 |
| Substrate | InP | n = 1 – 4 × $10^{17}$ | — |

In general each laser included N repeat units (RT plus I/R regions). In this example N=25. The digitally graded regions I-IV comprised multi-layered structures of alternating GaInAs and AlInAs layers well known in the art. Si was the impurity in all of the doped layers except the contact-facilitating layer which was doped with Sn. The undoped RT regions also comprised eight alternating pairs of AlInAs and GaInAs with thicknesses shown in Table II.

TABLE II

| RT Region | Thickness (A) | |
|---|---|---|
| GaInAs | 46 | Repeat 6× |
| AlInAs | 11 | |
| GaInAs | 45 | |
| AlInAs | 11 | |
| GaInAs | 43 | |
| AlInAs | 22 | |

The composition and thicknesses of the I/R regions are shown in Table III.

TABLE III

| I/R Region Composition | Doping Concentration (cm$^{-3}$) | Thickness (A) |
|---|---|---|
| GaInAs | undoped | 33 |
| AlInAs | undoped | 17 |
| GaInAs | undoped | 27 |
| AlInAs | undoped | 20 |
| GaInAs | undoped | 23 |
| AlInAs | undoped | 23 |
| GaInAs | undoped | 19 |
| AlInAs | undoped | 27 |

TABLE III-continued

| I/R Region Composition | Doping Concentration (cm$^{-3}$) | Thickness (A) |
|---|---|---|
| GaInAs | 5 × 10$^{17}$ | 16 |
| AlInAs | 5 × 10$^{17}$ | 31 |
| GaInAs | 5 × 10$^{17}$ | 14 |
| AlInAs | 5 × 10$^{17}$ | 34 |
| GaInAs | 5 × 10$^{17}$ | 12 |
| AlInAs | 5 × 10$^{17}$ | 37 |
| GaInAs | 5 × 10$^{17}$ | 11 |
| AlInAs | undoped | 40 |

In FIG. 4 we show the emission spectra of one laser from sample D2395 as detected in rapid-scan mode with a Fourier transform infrared spectrometer at a temperature of 80 K. At a drive current of 2 A only one laser line was visible at ~7.9 μm, but above 4 A a second line began to oscillate at ~6.6 μm, in good agreement with the expected wavelengths. Above 10 A, a third emission line appeared at approximately 7.3 μm. As we shall see later, the latter originates from a transition diagonal in k-space (states 4→2), but it acquires a large enough dipole matrix element only at relatively higher electric fields. Above 250 K lasing was achieved only at the two longer wavelengths (see the room-temperature spectrum shown in the inset of FIG. 4). The emission frequencies were red-shifted slightly (from 7.9 to 8.3 μm and from 7.3 to 7.6 μm, approximately) with temperature, and each line was actually composed of several longitudinal modes, as is typical for Fabry-Perot lasers.

The light-current characteristics of a laser which was 2.26 long and 13.7 μm wide are plotted for various temperatures in FIG. 5. The laser exhibited high peak optical powers (~1 W for the best device at 10 K) typical of QC SL lasers, but a pronounced kink appeared in all curves (indicated by the solid arrow 60 in FIG. 5), marking the threshold for the onset of the second emission line. A low temperature I-V curve is also shown in FIG. 5; laser emission started at an applied bias of about 6.5 V, in good agreement with the design electric field of 29 kV/cm in the active region (under the hypothesis that there is negligible voltage drop in the waveguide claddings and contact layers). The threshold current densities were measured precisely for each wavelength with the use of a monochromator as a spectral filter, and for the best lasers we obtained $J_{th}^{32}$=1.7 kA/cm$^2$ for the 7.9 μm transition and $J_{th}^{41}$=5.8 kA/cm$^2$ for the 6.6 μm transition at ~10 K. Computations indicate that $J_{th}^{32}$ should be about 1 kA/cm$^2$. However, we have to take into account that the electron population is not concentrated only in level 3, since a considerable number of electrons is also stored in level 4. By comparing the calculated with experimentally measured $J_{th}^{32}$, we infer that only 60% of the electrons are injected into level 3. Assuming that the remaining 40% is in level 4, and that the waveguide losses are proportional to $\lambda^2$, a dependence which is characteristic of free-carrier absorption, we obtain a theoretical estimate for $J_{th}^{41}$ of 3.8 kA/cm$^2$. This value is in satisfactory agreement with the experiment, especially considering the uncertainties in the model, which does not take into account other electrons in states of the upper miniband and other scattering paths that lead to non-unity injection efficiency into levels 3 and 4. Furthermore, although the differential resistance of all devices was very small (0.3–0.4 Ω), the applied field was slightly larger than the design field at the higher current density $J_{th}^{41}$, with an attendant reduction of the matrix elements of the transitions.

This effect explains also the origin the third laser line. At relatively high bias, the doping charges in the I/R regions are no longer sufficient to keep the SLs completely electric field free. Therefore, the SL translation and reflection symmetries are spoiled, and transitions which would be forbidden in an ideal SL can acquire larger dipole matrix elements. In particular, the level 4→2 transition (which is diagonal in k-space, as is evident from wavy arrow 42 of FIG. 2) gives rise to the 7.3 μm laser emission. Its turn-on corresponds to a sudden and continuous decrease in the power of the 6.6 μm line, as expected for two laser transitions sharing the electron population of the same upper level 4 and, therefore, competing for the same electrons.

More information on the actual behavior of our QC SL structure can be obtained by analyzing the luminescence spectra. For this purpose, another part of the D2395 wafer was processed into 125 μm-diameter round mesas (to rule out any gain effect). The side surface of the substrate was beveled inwardly at an angle of 45° to its top surface in order to efficiently collect the emitted light that was launched into the substrate and emerged through the beveled side surface. Spectra at various current densities are shown in FIG. 6. Three peaks with a width of approximately 15 meV are clearly identified in correspondence with the energy of each of the lasing transitions. Although the relative intensity of the peaks depends on response of the experimental set-up, it is evident from the inset that the intensity of the level 4→2 transition peak increases with current more rapidly than that of the other peaks, which we expect because its oscillator strength gets larger (and the other two decrease) with increasing bias. Emission at larger energies was also detected, due to transitions from states higher in the miniband. Note that a complete localization of the states over one or two wells induced by the penetration of the electric field into the RT region would give rise to completely different spectra and is not compatible with the measured current-voltage curves. Furthermore, the density of carriers stored in the upper miniband at threshold is estimated from the lifetimes to be ~6×10$^{10}$ cm 2, far less than the sheet density of doping in the I/R regions, which assures no space-charge effects caused by the injection.

Above 250 K the broadening became sufficiently large that the level 4→1 and level 4→2 emission lines could no longer be distinguished in the luminescence spectrum, and dual wavelength laser emission took place only at the two longer wavelength transitions; i.e., the emission lines corresponding to the level 4→2 vertical transition (in k-space) and level 3→2 diagonal transition (in k-space), as shown in FIG. 2.

Note that in the three-wavelength regime, our lasers operate on three coupled transitions involving four energy levels; i.e., a "4N" scheme; i.e., in FIG. 2 the vertical transitions 4→1 and 3→2 and diagonal transition 4→2 make the shape of the letter N in k-space. Other schemes, such as "5M" (FIG. 7) and "3V" (FIGS. 8–9) are also feasible, but are somewhat more difficult to realize as lasers than as spontaneous emission devices since the latter do not require a population inversion and, therefore, can tolerate more relaxation between the upper levels. In addition, in any scheme vertical transitions in k-space tend to be favored, as are transitions involving the lowest energy state in the upper miniband (state 2). Interesting effects should then stem from the direct coherent coupling between the oscillating modes. For the same reason our structure is also of potential interest for use in correlated spontaneous-emission or quantum-beat semiconductor lasers.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention In particular, dual wavelength QC optical sources can be used to determine the absorption of a gaseous sample at wavelengths $\lambda_1$ and $\lambda_2$, for example to determine the concentration of a particular chemical compound in the measurement sample. In a typical application, known as differential spectroscopy, light at one wavelength experiences a different effect (e.g., degree of absorption) in the sample than light at the other wavelength. FIG. 10 schematically shows such a measuring apparatus 70, with numerals 71–73 referring, respectively, to the dual wavelength optical source, sample and detector. The measurement sample can be confined in the a measuring cell or may be unconfined.

What is claimed is:

1. A quantum cascade (QC) superlattice (SL) light source comprising:

a core region including a QC active region which comprises a multiplicity of repeat units, each repeat unit including a unipolar radiative transition (RT) SL region and an injection/relaxation (I/R) region, each of said RT SL regions comprising a plurality of quantum well (QW) layers interleaved with a plurality of barrier layers, said QW layers having energy states characterized by upper and lower minibands, and electrodes for applying an electric field to said source effective to cause said RT regions to generate light at energies determined by upper and lower energy levels within said upper and lower minibands, respectively, characterized in that said lower miniband has at least a first level and said upper miniband has at least third and fourth energy levels, electron transitions between a first pair of said upper and lower levels generating light at a first spontaneous emission line having a center wavelength $\lambda_1$ and a line broadening first energy and electron transitions between a second pair of said upper and lower levels generating light at a second spontaneous emission line having a center wavelength $\lambda_2$ and a line broadening second energy, the energy separation of said center wavelengths is greater than the larger of said first and second line broadening energies, and means for inhibiting the relaxation of electrons from said fourth level to said third level.

2. The invention of claim 1 wherein said inhibiting means hinders the emission of optical phonons in said active region.

3. The invention of claim 2 wherein said inhibiting means makes the energy separation between said upper levels smaller than the energy of an optical phonon in said active region.

4. The invention of claim 1 wherein said lower miniband has first and second energy levels, and said first and second pairs of energy levels include both of said upper levels and at least one of said lower levels.

5. The invention of claim 1 wherein said lower miniband has first and second energy levels, and said first and second pairs of energy levels include both of said upper levels and both of said lower levels.

6. The invention of claim 1 wherein electron transitions between a third pair of said upper and lower levels generates light at a third spontaneous emission line having a center wavelength $\lambda_3$ and a line broadening third energy, said source emitting light at at least two of said emission lines, the energy separation of the center wavelengths of said at least two emission lines being greater than the larger of the line broadening energies of either of said two lines.

7. The invention of claim 1 wherein said energy levels montonically decrease in energy from the fourth to the first, said first pair comprising said fourth and first levels and said second pair comprising said third and second levels.

8. The invention of claim 1 wherein said energy levels montonically decrease in energy from the fourth to the first, said first pair comprising said fourth and second levels and said second pair comprising said third and second levels.

9. The invention of claim 1 wherein said RT regions are undoped.

10. The invention of claim 1 including means for rendering said minibands essentially flat in the presence of said applied field.

11. The invention of claim 1 wherein said active region comprise layers of Group III-V compound semiconductors.

12. The invention of claim 11 wherein said active region comprises layers of GaInAs and AlInAs.

13. The invention of claim 1 wherein said QC light source is a QC laser.

14. The invention of claim 1 wherein said QC light source is a QC spontaneous emission device.

15. Apparatus for measuring light absorption of a gaseous measurement sample at wavelengths $\lambda_1$ and $\lambda_2$ comprising a QC light source according to claim 1 for directing light at wavelengths $\lambda_1$ and $\lambda_2$ into said sample and at least one optical detector for detecting light of wavelengths $\lambda_1$ and $\lambda_2$ emerging from said sample.

16. A quantum cascade (QC) superlattice (SL) laser comprising:

a core region including a QC active region which comprises a multiplicity of repeat units, each repeat unit including a unipolar, undoped radiative transition (RT) SL region and an injection/relaxation (I/R) region, each of said RT SL regions comprising a plurality of GaInAs quantum well (QW) layers interleaved with a plurality of AlInAs barrier layers, said QW layers having energy states characterized by upper and lower minibands, upper and lower cladding regions bounding said core region, an optical cavity resonator, said core region being disposed in said resonator, electrodes for applying current above the lasing threshold to said active region effective to cause said RT regions to generate stimulated emission of light at energies determined by upper and lower energy levels within said upper and lower minibands, respectively, and means for rendering said minibands essentially flat in the presence of said applied field, characterized in that said lower miniband has first and second lower energy levels and said upper miniband has third and fourth upper energy levels, said energy levels montonically decreasing in energy from the fourth to the first, below said lasing threshold electron transitions between said fourth and first levels generate light at a first spontaneous emission line having a center wavelength $\lambda_1$ and a line broadening first energy and between said third and second levels generate light at a second spontaneous emission line having a center wavelength $\lambda_2$ and a line broadening second energy, the energy separation of said center wavelengths is greater than the larger of said first and second line broadening energies, and the energy separation of said upper levels is less than the energy of an optical phonon in said active region.

* * * * *